United States Patent
Glass et al.

(10) Patent No.: US 8,957,476 B2
(45) Date of Patent: Feb. 17, 2015

(54) CONVERSION OF THIN TRANSISTOR ELEMENTS FROM SILICON TO SILICON GERMANIUM

(71) Applicants: Glenn A. Glass, Beaverton, OR (US); Daniel B. Aubertine, North Plains, OR (US); Anand S. Murthy, Portland, OR (US); Gaurav Thareja, Hillsboro, OR (US); Stephen M. Cea, Hillsboro, OR (US)

(72) Inventors: Glenn A. Glass, Beaverton, OR (US); Daniel B. Aubertine, North Plains, OR (US); Anand S. Murthy, Portland, OR (US); Gaurav Thareja, Hillsboro, OR (US); Stephen M. Cea, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/722,801

(22) Filed: Dec. 20, 2012

(65) Prior Publication Data

US 2014/0175543 A1    Jun. 26, 2014

(51) Int. Cl.
*H01L 21/8234* (2006.01)
*H01L 27/088* (2006.01)

(52) U.S. Cl.
CPC .... *H01L 21/823431* (2013.01); *H01L 27/0886* (2013.01)
USPC ............ 257/337; 257/400; 257/478; 438/285

(58) Field of Classification Search
CPC ........ H01L 29/78; H01L 29/772; H01L 21/20
USPC .................. 257/288, 308, 400–408; 438/478
See application file for complete search history.

(56) References Cited

U.S. PATENT DOCUMENTS

| | | |
|---|---|---|
| 2005/0285192 A1 | 12/2005 | Zhu |
| 2006/0065927 A1 | 3/2006 | Thean et al. |
| 2006/0157687 A1 | 7/2006 | Doyle et al. |
| 2009/0170251 A1* | 7/2009 | Jin et al. .......................... 438/197 |
| 2010/0044762 A1* | 2/2010 | Orlowski ........................ 257/288 |
| 2010/0144121 A1* | 6/2010 | Chang et al. ................... 438/478 |

(Continued)

FOREIGN PATENT DOCUMENTS

KR     1020100096480 A     9/2010

OTHER PUBLICATIONS

Khakifirooz et al. Strain Engineered Extremely Thin SOI (ETSOI) for High-Performance CMOS, 2012 Symposium on VLSI Technology Digest of Technical Papers, p. 117-118.

(Continued)

*Primary Examiner* — Marc Armand
*Assistant Examiner* — Quinton Brasfield
(74) *Attorney, Agent, or Firm* — Schwabe, Williamson & Wyatt, P.C.

(57) ABSTRACT

Embodiments of the present disclosure provide techniques and configurations associated with conversion of thin transistor elements from silicon (Si) to silicon germanium (SiGe). In one embodiment, a method includes providing a semiconductor substrate having a channel body of a transistor device disposed on the semiconductor substrate, the channel body comprising silicon, forming a cladding layer comprising germanium on the channel body, and annealing the channel body to cause the germanium to diffuse into the channel body. Other embodiments may be described and/or claimed.

16 Claims, 10 Drawing Sheets

(56) References Cited

U.S. PATENT DOCUMENTS

| | | | |
|---|---|---|---|
| 2011/0147811 A1* | 6/2011 | Kavalieros et al. | 257/288 |
| 2011/0193141 A1* | 8/2011 | Lin et al. | 257/255 |
| 2011/0227165 A1* | 9/2011 | Basker et al. | 257/369 |
| 2012/0217467 A1* | 8/2012 | Tan et al. | 257/9 |
| 2012/0309173 A1* | 12/2012 | Shah et al. | 438/478 |
| 2013/0334610 A1* | 12/2013 | Moroz et al. | 257/369 |

OTHER PUBLICATIONS

U.S. Appl. No. 13/560,513, filed Jul. 27, 2012.
U.S. Appl. No. 13/560,474, filed Jul. 27, 2012.
U.S. Appl. No. 12/958,179, filed Dec. 1, 2010.
U.S. Appl. No. 13/560,531, filed Jul. 27, 2012.
International Search Report for International Application No. PCT/US2013/047988, mailed Sep. 30, 2013.

* cited by examiner

CONVERSION OF THIN TRANSISTOR ELEMENTS FROM SILICON TO SILICON GERMANIUM

FIELD

Embodiments of the present disclosure generally relate to the field of integrated circuits, and more particularly, to techniques and configurations associated with conversion of thin transistor elements from silicon (Si) to silicon germanium (SiGe).

BACKGROUND

Mobility of charge carriers in transistor devices with silicon channel materials may be increased by introducing germanium into the silicon channel. However, current methods of providing germanium into the silicon channel may be costly or difficult due to shrinking transistor features associated with creation of smaller transistor devices for greater performance and/or providing smaller dies for smaller die implementations such as, for example, for use in mobile computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
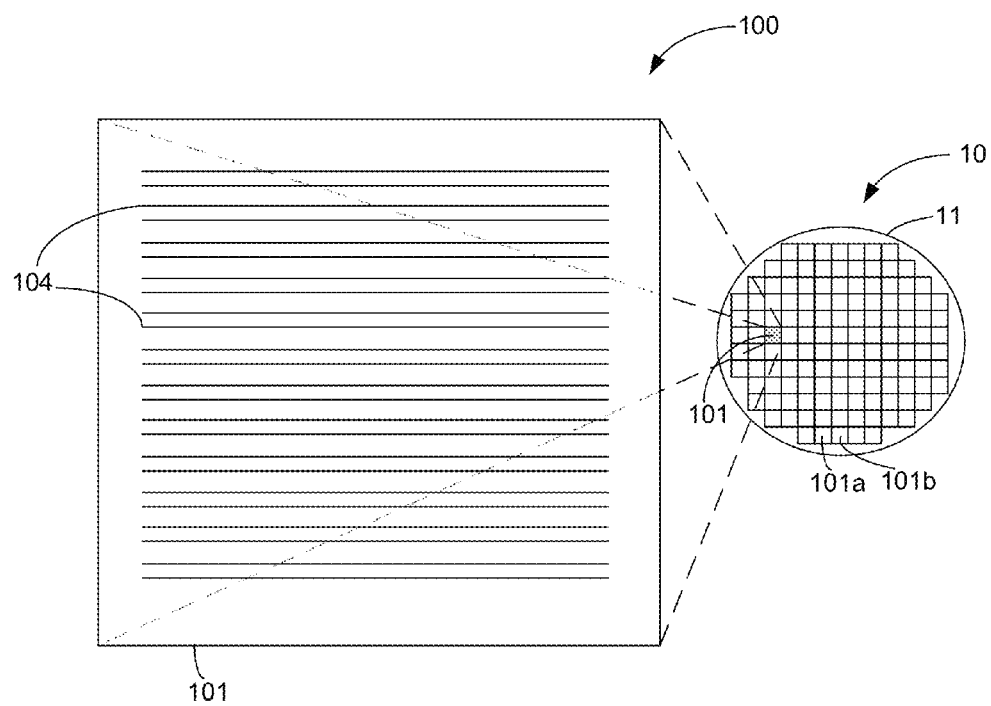
FIG. 1 schematically illustrates an example die in wafer form and in singulated form, in accordance with some embodiments.

Embodiments of the present disclosure provide techniques and configurations associated with conversion of thin transistor elements from silicon (Si) to silicon germanium (SiGe). The thin transistor elements may include, for example, channel bodies of transistor devices of an integrated circuit (IC) die. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates an example die 101 in wafer form 10 and in singulated form 100, in accordance with some embodiments. In some embodiments, the die 101 may be one of a plurality of dies (e.g., dies 101, 101a, 101b) formed on a wafer 11 composed of semiconductor material. The plurality of dies may be formed on a surface of the wafer 11. Each of the dies may be a repeating unit of a semiconductor product that includes a plurality of transistors.

The transistors may be formed using transistor elements 104 as described herein such as, for example, fin structures, nanowires or planar structures that may be used to form channel bodies of the transistors. Although the transistor elements 104 are depicted in rows that traverse a substantial portion of the die 101 in FIG. 1, subject matter is not limited in this regard, and any other suitable configuration of the transistor elements 104 may be used according to various embodiments.

After a fabrication process of the semiconductor product is complete, the wafer 11 may undergo a singulation process in which each of the dies (e.g., die 101) is separated from one another to provide discrete "chips" of the semiconductor product. The wafer 11 may be any of a variety of sizes. In some embodiments, the wafer 11 has a diameter ranging from about 25.4 mm to about 450 mm. The wafer 11 may include other sizes and/or other shapes in other embodiments. According to various embodiments, the transistor elements 104 may be disposed on a semiconductor substrate in wafer form 10 or singulated form 100. Transistor elements 104 described herein may be incorporated in a die 101 for logic or memory, or combinations thereof.

Figure 2:
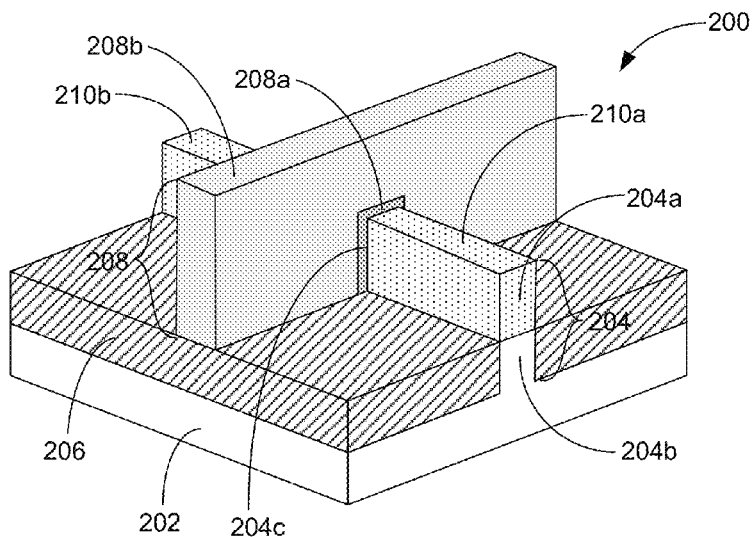
FIG. 2 schematically illustrates a perspective view of a transistor device, in accordance with some embodiments.

FIG. 2 schematically illustrates a perspective view of a transistor device 200, in accordance with some embodiments. In some embodiments, the transistor device 200 includes a semiconductor substrate 202, a fin structure 204 including a portion composed of SiGe alloy (hereinafter "SiGe portion 204a") and a portion composed of Si (hereinafter "Si portion 204b"), electrically insulative material 206, a gate 208 including a gate dielectric 208a and gate electrode 208b, coupled as can be seen.

The transistor device 200 may represent a transistor or part of a transistor in various embodiments. For example, the fin structure 204 may extend along a surface of the semiconductor substrate 202 (e.g., through material of gate 208). A source and drain (not shown) may be formed on portions 210a and 210b of the fin structure 204 that are separated by the gate 208 to provide a source and drain for mobile charge carriers (e.g., holes or electrons) that may flow through a channel body 204c formed from the fin structure 204. The gate 208 may, for example, be configured to control the flow of the mobile charge carriers through the channel body 204c by application of a threshold voltage to the gate electrode 208b. The channel body 204c may include part of a fin structure 204 formed from Si of the semiconductor substrate 202. In some embodiments, the channel body 204c may include portions of the SiGe portion 204a of the fin structure 204 and may be disposed in a gate region between the source and the drain.

The semiconductor substrate 202 may be composed of Si in some embodiments. For example, the semiconductor substrate 202 may include n-type or p-type (100) off-oriented Si, the crystalline directions of the semiconductor substrate 202 being symbolized by the convention (xyz), where x, y, and z represent respective crystallographic planes in three dimensions that are perpendicular to one another. The semiconductor substrate 202 may, for example, include material of a (100) direction off-cut in a range between about 2 degrees to about 8 degrees towards a (110) direction. Other off-cut orientations or a semiconductor substrate 202 without an off-cut orientation may be used. Off-cutting may eliminate antiphase boundaries. The semiconductor substrate 202 may have a high resistivity between about 1 Ω-cm to about 50 Ω-cm. The semiconductor substrate 202 may include other materials in other embodiments. In some embodiments, the semiconductor substrate 202 is part of a singulated die of a wafer. In one embodiment, the semiconductor substrate is a p-type substrate.

According to various embodiments, the SiGe portion 204a of the fin structure 204 may be formed by converting a transistor element such as, for example, the fin structure 204 from Si to SiGe using techniques described herein. In the depicted embodiment, only a portion (e.g., SiGe portion 204a) of the fin structure 204 is converted from Si to SiGe. The Si portion 204b of the fin structure 204 may be composed of a defect-free single crystal in some embodiments. In other embodiments, most or all of the transistor element (e.g., fin structure 204) may be converted from Si to SiGe.

The transistor device 200 may be p-type or n-type. The channel body 204c formed using the SiGe portion 204a may provide greater mobility of mobile charge carriers for p-type. For example, increasing a concentration of germanium (Ge) in the channel body 204c may increase mobility of electrons or holes by nature of the material. A second mechanism causes further increase in the mobility of the holes in the p-channel (e.g., channel of PMOS device) by providing a compressive strain to the channel body 204c. The compressive strain of the SiGe portion 204a will reduce mobility of electrons for n-channel (e.g., channel of NMOS device). Thus, increasing the concentration of Ge in the n-channel may result in little to no mobility improvement for electrons. In one embodiment, the transistor device 200 is p-type (e.g., PMOS device). The PMOS device may have a p-channel that is doped n-type and the NMOS device may have an n-channel that is doped p-type.

The electrically insulative material 206 may be deposited on the semiconductor substrate 202 and may abut the fin structure 204, as can be seen. The electrically insulative material 206 may include any suitable material for shallow trench isolation (STI). In some embodiments, the electrically insulative material 206 may include dielectric materials known for their applicability in integrated circuit structures, such as low-k dielectric materials. Examples of dielectric materials that may be used include, but are not limited to, silicon oxide, carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass.

The gate dielectric 208a may be formed on the channel body 204c and may be composed of a material such as silicon dioxide ($SiO_2$) or a high-k material. Examples of high-k materials that may be used to form the gate dielectric 208a include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric 208a to improve its quality when a high-k material is used. In some embodiments, the gate dielectric 208a may include a dummy oxide that is subsequently removed in a process flow together with a dummy gate electrode and replaced with a high-k gate dielectric and metal gate, according to well-known techniques.

The gate electrode 208b may be formed on the gate dielectric 208a and may be composed of at least one p-type workfunction metal or n-type workfunction metal, depending on whether the transistor is to be a PMOS (e.g., p-type) or an NMOS (e.g., n-type) transistor. In some embodiments, the gate electrode 208b may consist of two or more metal layers, where at least one metal layer is a workfunction metal layer and at least one metal layer is a fill metal layer. In some embodiments, the gate electrode 208b is a polysilicon gate electrode. In other embodiments, the gate electrode 208b is a dummy polysilicon gate electrode that is subsequently removed in a process flow and replaced with a metal gate electrode, according to well-known techniques.

For a PMOS transistor, metals that may be used for the gate electrode include, but are not limited to, ruthenium, palladium, platinum, cobalt, nickel, and conductive metal oxides, e.g., ruthenium oxide. A p-type metal layer may enable the formation of a PMOS gate electrode with a workfunction that is between about 4.9 eV and about 5.2 eV. For an NMOS transistor, metals that may be used for the gate electrode 208b include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An n-type metal layer may enable the formation of an NMOS gate electrode with a workfunction that is between about 3.9 eV and about 4.2 eV.

In some embodiments, a pair of spacers (not shown) may bracket the gate 208. For example, the spacers may be disposed on opposing surfaces of the gate electrode 208b. The spacers may be formed from a material such as silicon nitride, silicon oxide, silicon carbide, silicon nitride doped with carbon, and silicon oxynitride. Processes for forming spacers may generally include deposition and etching processes and/or other well-known techniques.

The transistor device 200 of FIG. 2 depicts a tri-gate configuration. In other embodiments, similar principles and techniques as described herein for converting a transistor element from Si to SiGe may be used for other transistor configurations including, for example, planar, dual-gate, all around gate (AAG) (also referred to as gate all around), wire (e.g., nanowire), and other suitable transistor configurations.

FIGS. 3a-f schematically illustrate a cross-section side view of a transistor element (e.g., fin structure) subsequent to various fabrication operations, in accordance with some embodiments. Structures, techniques and configurations described in connection with FIGS. 3a-f may comport with analogous structures, techniques and configurations described in connection with FIG. 2 and vice versa.

Figure 3A:
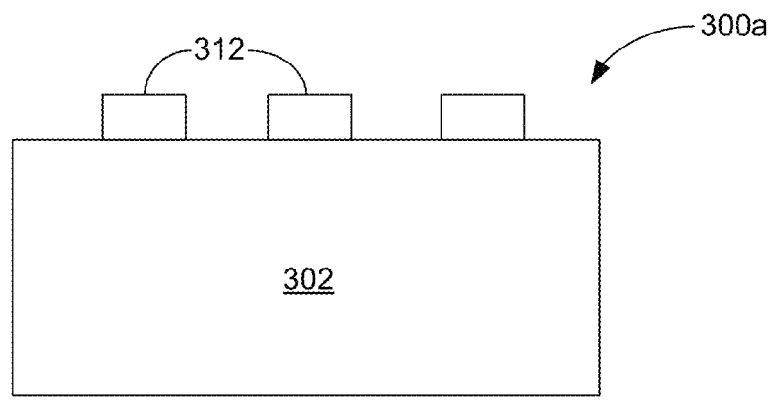
FIGS. 3a-f schematically illustrate a cross-section side view of a transistor element subsequent to various fabrication operations, in accordance with some embodiments.

Referring to FIG. 3a, a transistor element 300a is depicted subsequent to depositing and patterning a mask material 312 on the semiconductor substrate 302. In some embodiments, the mask material 312 may be a hardmask such as, for example, silicon oxide. In some embodiments, the mask material 312 may be a photodefinable material. Patterning may include lithography and/or etch processes in some embodiments.

Figure 3B:
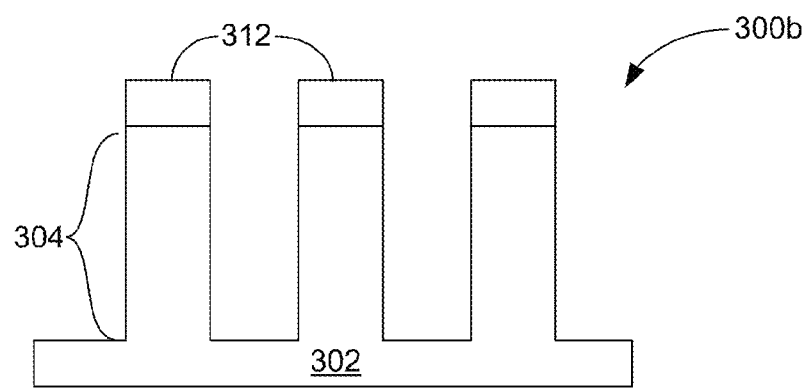

Referring to FIG. 3b, a transistor element 300b is depicted subsequent to recessing the semiconductor substrate 302 to form one or more fin structures 304 (e.g., hereinafter "fin structures 304"). The mask material 312 may protect portions of the semiconductor substrate 302 from a recessing process such as, for example, an anisotropic etch process that removes material of the semiconductor substrate 302. The recessing process may form trenches in areas of the removed material of the semiconductor substrate 302 and form the fin structures 304 in areas protected by the mask material 312.

Figure 3C:
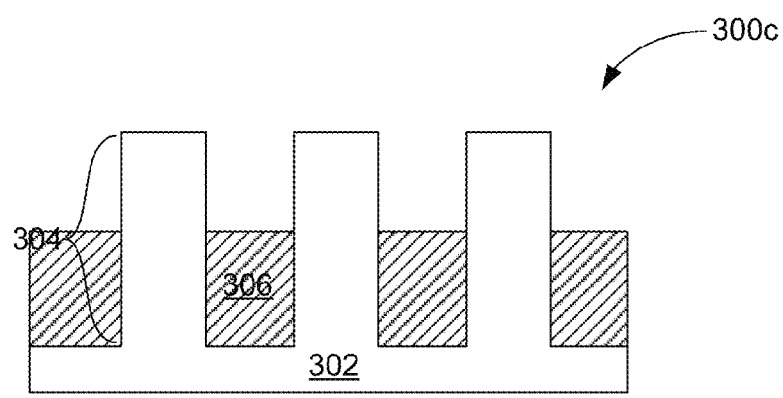

Referring to FIG. 3c, a transistor element 300c is depicted subsequent to depositing an electrically insulative material 306 on the semiconductor substrate 302. The hard mask 312 may be removed by etch processes and the electrically insulative material 306 may be deposited on surfaces of the semiconductor substrate 302 and fin structures 304. The electrically insulative material 306 may be recessed using, for example, an etch process to expose an end portion of the fin structures 304 while still covering a base portion of the fin structures 304, as can be seen.

Figure 3D:
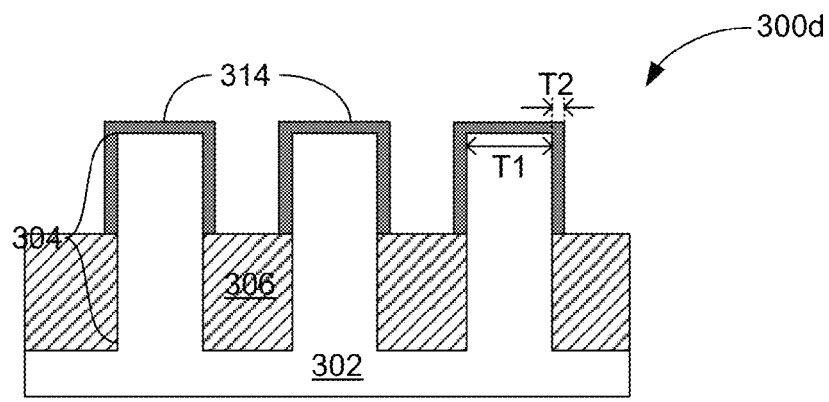
Figure 3E:
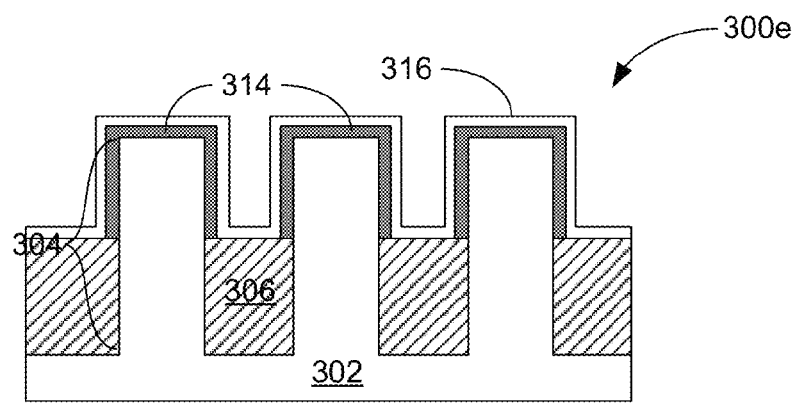
Figure 3F:
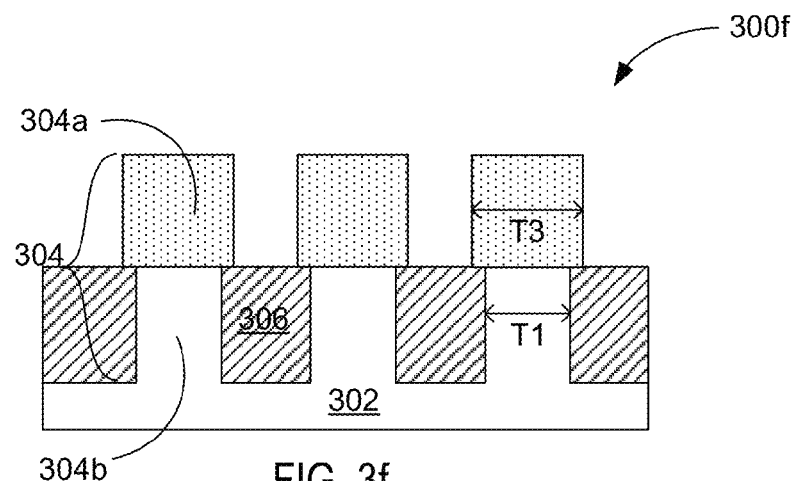
Figure 11:
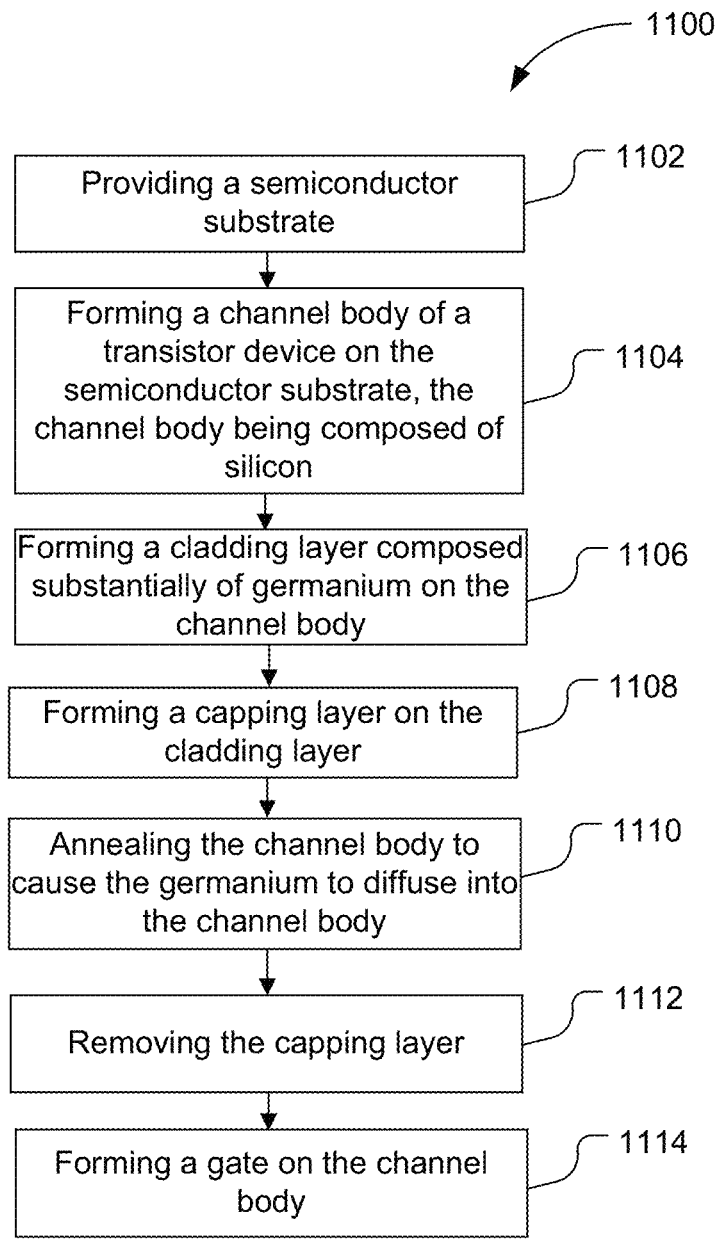
FIG. 11 schematically illustrates a flow diagram for a method of converting a transistor element from Si to SiGe, in accordance with some embodiments.

FIGS. 3d-f depict a transistor element subsequent to actions in accordance with a first technique to convert Si to SiGe (e.g., the method 1100 of FIG. 11). Referring to FIG. 3d, a transistor element 300d is depicted subsequent to depositing Ge to form a cladding layer 314 composed of Ge on the fin structures 304, as can be seen.

Deposition of the Ge may be selective to the electrically insulative material 306. That is, in some embodiments, the Ge may be selectively deposited on the fin structures 304 but not the electrically insulative material 306 to form the cladding layer 314. In some embodiments, the deposition of the Ge may be conformal on the fin structures 304, as can be seen in FIG. 3d, or faceted (e.g., as depicted in connection with FIG. 4b). In some embodiments, the cladding layer 314 may be crystalline including, for example, single crystal or polycrystalline configurations. In other embodiments, the cladding layer 314 may preferably be amorphous (e.g., by amorphous deposition) to provide a conformal profile as depicted.

Selective deposition of Ge to provide an amorphous configuration of the cladding layer 314 may be performed according to a variety of suitable techniques including, for example, gas source molecular beam epitaxy (GS-MBE), chemical vapor deposition (CVD) or rapid thermal CVD (RT-CVD). A high molecular weight precursor such as digermane may be used for such selective deposition at temperatures between about 300° C. and 400° C. Digermane may be used for selective deposition at pressures ranging from about 20 Torr to about 90 Torr. Germane may be used for selective deposition at lower pressures ranging from about 20 milliTorr (mTorr) to about 500 mTorr and may require higher process temperatures greater than 350° C. In other embodiments, deposition of the Ge may not be selective to the electrically insulative material 306.

Selective deposition of Ge to provide a crystalline configuration of the cladding layer 314 may be performed using germane and deposition temperature may be up to 500° C. in some embodiments. In some embodiments Ge in crystalline form may generally facet along (111) planes.

The fin structures 304 may be thin transistor elements. In some embodiments, a fin structure may have a thickness T1, as can be seen. The thickness T1 may, for example, range from 5 to 25 nm. In one embodiment, the thickness T1 is about 10 nm. In embodiments where the deposition of the Ge is conformal, the cladding layer 314 may have a thickness, T2, as can be seen. The thickness T2 may, for example, range from 0.5 to 6 nm. In one embodiment, the thickness T2 is about 4 nm. The thicknesses T1 and T2 may have other values in other embodiments.

The Ge of the cladding layer 314 may be deposited with or without dopants according to various embodiments. In some embodiments, the cladding layer 314 is composed solely of Ge. In other embodiments, the cladding layer 314 is composed of Ge doped lightly with an n-type dopant such as phosphorous (P) or arsenic (As) to provide barriers to source/drain off-state current leakage in PMOS transistors. Other suitable dopants may be used in other embodiments.

Referring to FIG. 3e, a transistor element 300e is depicted subsequent to depositing a capping layer 316 on the cladding layer 314, as can be seen. The capping layer 316 may preserve a shape and compositional integrity of the cladding layer 314 prior to and during anneal. For example, in some embodiments, if anneal is performed without the capping layer 316, the cladding layer 314 may flow at temperatures well below the melting point of Ge and agglomerate in spaces between the fin structures 304 resulting in SiGe structures with non-uniform, inconsistent, or inadequate concentration of Ge.

The capping layer 316 may provide structural stability of the transistor element 300e during anneal. For example, the capping layer 316 may be composed of a material that structurally withstands the anneal, prevents contamination of the cladding layer 314 during the anneal, and is removable after the anneal. According to various embodiments, the capping layer 316 may include, for example, silicon nitride, silicon oxide, titanium nitride, and like materials. In some embodiments, the capping layer 316 may have a thickness of 2 nanometers (nm) or greater. The capping layer 316 may be deposited to substantially fill the space between the fin structures 304 in some embodiments. The capping layer 316 may include other materials or thicknesses in other embodiments.

Referring to FIG. 3f, a transistor element 300f is depicted subsequent to annealing the fin structures 304. The anneal may cause Ge to diffuse into Si of the fin structures 304 and form a structure comprising SiGe alloy (hereinafter "SiGe portion 304a"). In some embodiments, subsequent to anneal, a portion of the fin structures 304 is composed of Si and may be referred to as Si portion 304b.

Subsequent to anneal, the capping layer 316 may be removed using any suitable technique including, for example, an etch process. The etch process may include, for example, wet etch fluorine chemistry (e.g., hydrofluoric acid) to remove a capping layer 316 composed of oxide. In other embodiments, the etch process may include phosphoric acid chemistry that is selective to oxide to remove nitride without substantially removing electrically insulative material 306 composed of oxide.

In some embodiments, the anneal is performed at temperatures greater than 700° C. such as, for example, 800° C. in an inert ambient such as nitrogen. The anneal time may be selected to provide a desired composition profile of Ge in the Si of the fin structures 304. For example, in some embodiments, the anneal time may be selected to fully or substantially fully convert the Si of the fin structures 304 that is encapsulated by the cladding layer 314 to SiGe. In one embodiment, a thin transistor element (e.g., fin structures 304) may be fully converted from Si to SiGe by annealing at 800° C. for about one hour.

In other embodiments, the anneal time may be selected to partially convert the Si of the fin structures 304 that is encapsulated by the cladding layer 314 to SiGe. For example, the anneal time may be less than an hour (e.g., from seconds to fifteen minutes) at 800° C. to partially convert the Si of a thin transistor element to SiGe. An anneal that partially converts the Si to SiGe may provide a Ge-rich surface on the fin structures 304 relative to a central portion of the fin structures 304. Example composition profiles of Ge in the fin structures 304 for various anneal times are further described in connection with FIG. 8. The anneal is not limited to the example time and temperature presented here and may include other suitable temperatures and anneal times in other embodiments. For example, an anneal time may range from seconds to days depending on a selected temperature and desired composition of SiGe in the thin transistor element.

A thickness, T3, of the SiGe portion 304a of the fin structures 304 may be greater than the thickness T1 of the Si portion 304b. In some embodiments, the thickness T3 is roughly equivalent to the thickness T1 plus twice the thickness T2 of the cladding layer 314 as depicted in FIG. 3d. Similar principles may apply to other structures such as, for example, nanowires.

Figure 12:
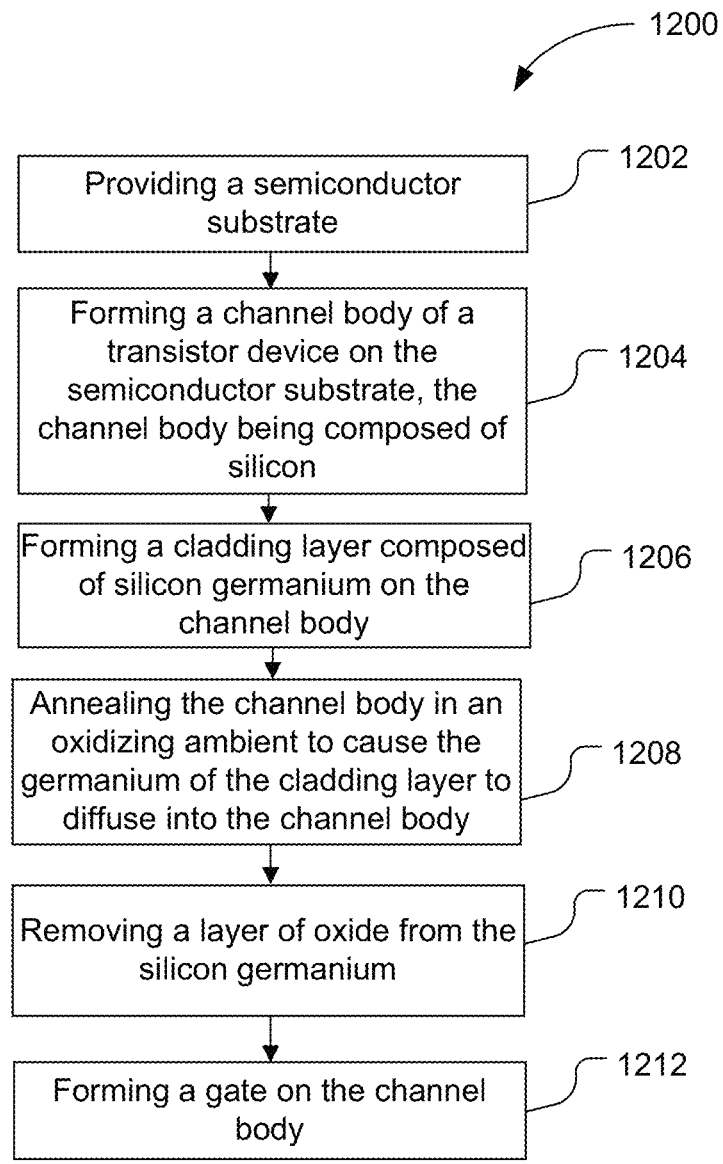
FIG. 12 schematically illustrates a flow diagram for another method of converting a transistor element from Si to SiGe, in accordance with some embodiments.

FIGS. 4a-d depict a transistor element subsequent to actions in accordance with a second technique to convert Si to SiGe (e.g., the method 1200 of FIG. 12). Structures, techniques and configurations described in connection with FIGS. 4a-d may comport with analogous structures, techniques and configurations described in connection with FIG. 2 and vice versa. For example, although the SiGe deposition of FIGS. 4a-d is depicted for a crystalline configuration (e.g., faceted), in some embodiments, the SiGe deposition of FIGS. 4a-d may preferably be conformal by amorphous or otherwise tailored deposition to provide a cladding layer profile as described and/or depicted in connection with FIGS. 3d-f.

Figure 4A:
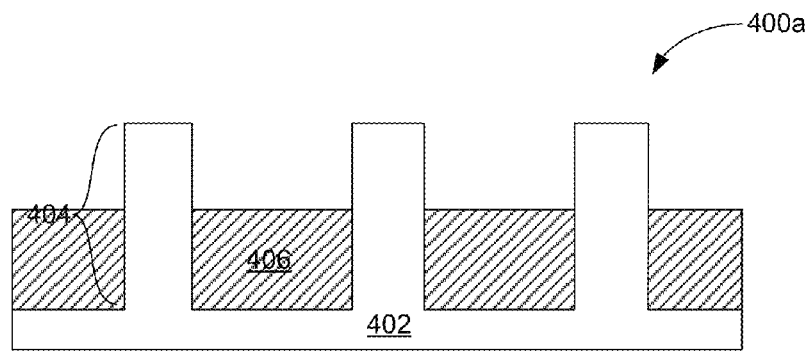
FIGS. 4a-d schematically illustrate a cross-section side view of a transistor element subsequent to other various fabrication operations, in accordance with some embodiments.

Referring to FIG. 4a, a transistor element 400a is depicted subsequent to forming fin structures 404 in a semiconductor substrate 402 and depositing electrically insulative material 406 on the semiconductor substrate 402 between individual fin structures of the fin structures 404, as can be seen. According to various embodiments, the transistor element 400a may be formed according to techniques described in connection with FIGS. 3a-c.

Figure 4B:
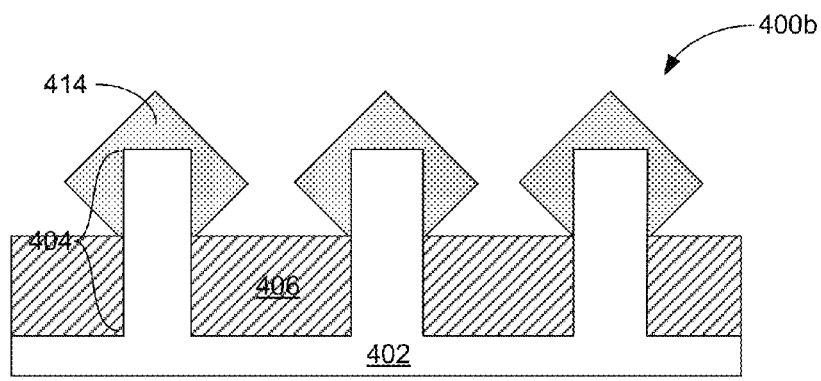

Referring to FIG. 4b, a transistor element 400b is depicted subsequent to depositing SiGe to form a cladding layer 414 composed of SiGe on the fin structures 404, as can be seen. According to various embodiments, the $Si_{1-x}Ge_x$ deposited to form the cladding layer 414 may have a composition where x is a value between 0.15 and 0.7 representing a ratio of Ge to Si. In some embodiments, x is a value between 0.2 and 0.5.

Similar to the first technique, deposition of the SiGe according to the second technique may provide crystalline (e.g., single crystal, polycrystalline) configuration of a faceted cladding layer 414 (e.g., as depicted in FIG. 4b) or amorphous configuration of a conformal cladding layer 414. Deposition of the cladding layer 414 may be selective or non-selective to the electrically insulative material 406 and/or may include undoped SiGe or SiGe that is doped with an n-type dopant such as P or As similar as described in connection with the first technique. The SiGe may be deposited on all fin structures 404 or only on selected fins (e.g., by masking) to enable unique p-channel and n-channel compositions and/or to create multiple different concentration levels in multiple different fin structures 404 as desired.

Figure 4C:
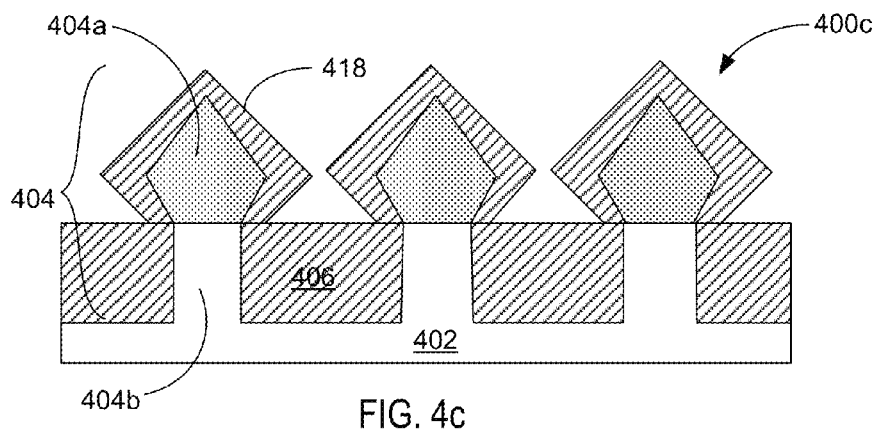

Referring to FIG. 4c, a transistor element 400c is depicted subsequent to annealing the fin structures 404. The anneal may cause Ge of the SiGe cladding layer 414 to diffuse into Si of the fin structures 404 and form a structure comprising SiGe alloy (hereinafter "SiGe portion 404a"). In some embodiments, subsequent to anneal, a portion of the fin structures 404 is composed of Si and may be referred to as Si portion 404b.

In some embodiments, the anneal is performed in an oxidizing ambient and forms a layer of oxide 418 including silicon oxide and to a much lesser extent germanium oxide. The oxidizing ambient may include, for example, oxygen, moisture, and/or nitrous oxide. Anneal in the oxidizing ambient may accelerate intermixing of Si and Ge relative to anneal in an inert ambient.

The anneal conditions may be tuned by adjusting anneal temperature and/or anneal time to provide an oxidation rate and diffusion rate for intermixing of Si and Ge that is compatible with a desired thickness of the resulting structures (e.g., fin structures 404). In some embodiments, conditions for anneal may include temperatures ranging, for example, from 700° C. to 1200° C. for anneal times of second to hours to days depending on the selected temperature and desired composition of Ge in the SiGe portion 404a.

According to various embodiments, subsequent to the anneal in oxidizing ambient, some of the Si of the fin structures 404 may be converted to oxide 418 (e.g., silicon dioxide) and the average composition of Ge in the SiGe portion 404a may be close or equal to the composition of Ge in the deposited cladding layer 414 composed of SiGe. Owing to deposition of a cladding layer (e.g., cladding layer 414) with sufficient thickness to provide sufficient Ge for diffusion, the second technique of SiGe cladding may provide a thickness that is greater than the thickness T3 of FIG. 3f for a given amount of Ge added compared with the first technique of Ge cladding. The oxide 418 may be used to trim back the fin width (e.g., by an etching process described in connection with FIG. 4d) to increase electrostatic control of the channel.

Figure 4D:
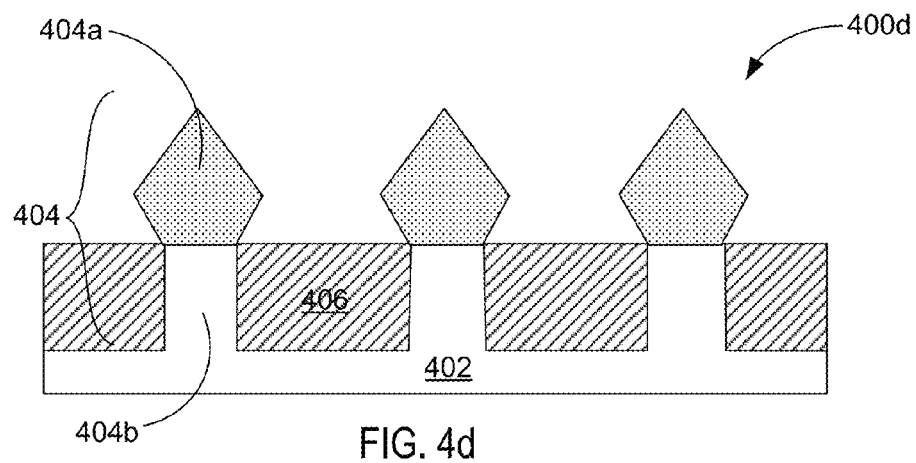

Referring to FIG. 4d, a transistor element 400d is depicted subsequent to removing the oxide 418 of FIG. 4c. The oxide 418 may be removed using any suitable process including, for example, an etch process using hydrofluoric acid. In cases where the electrically insulative material includes an oxide, the electrically insulative material 406 may be slightly recessed during the oxide 418 removal process.

The first technique and second technique described in connection with FIGS. 3d-f and 4a-d may be modified to convert Si of the Si portion 404b to SiGe in some embodiments. For example, in some embodiments, the electrically insulative material deposited in FIGS. 3c and 4a may not be deposited until after the anneal has been performed. That is, in some embodiments, the deposition of cladding layer (e.g., 314 or 414) and anneal may take place prior to deposition of the electrically insulative material (e.g., 306 or 406) to provide a fin structure (e.g., including Si portions 304b and 404b) that is wholly converted from Si to SiGe.

Figure 5:
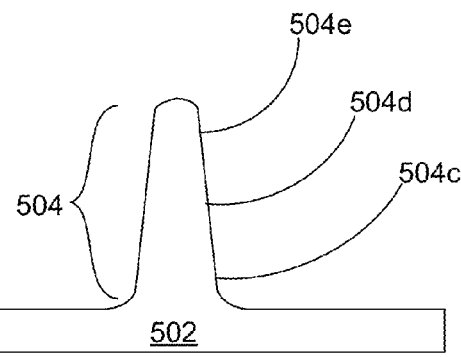
FIG. 5 schematically illustrates a cross-section side view of a fin structure, in accordance with some embodiments.

FIG. 5 schematically illustrates a cross-section side view of a fin structure 504, in accordance with some embodiments. The fin structure 504 may comport with fin structures described in connection with FIGS. 1-4 and vice versa.

The fin structure 504 may be formed from material of the semiconductor substrate 502 as described herein. In some embodiments, a profile of the fin structure 504 may include a base portion 504c adjacent to the semiconductor substrate 502, a middle portion 504d, and an end portion 504e, the middle portion 504d being disposed between the base portion 504c and the end portion 504e, as can be seen. Prior to conversion of Si of the fin structure 504 to SiGe, the base portion 504c may have a thickness that is greater than a thickness of the middle portion 504d and the middle portion 504d may have a thickness that is greater than a thickness of the end portion 504e, as can be seen.

Features of the fin structure 504 may include arcuate, curved profiles consistent with patterning processes used to form the fin structure, as can be seen. The profile of the fin structure 504 may have other shapes or configurations consistent with well-known semiconductor fabrication techniques in other embodiments.

Figure 6:
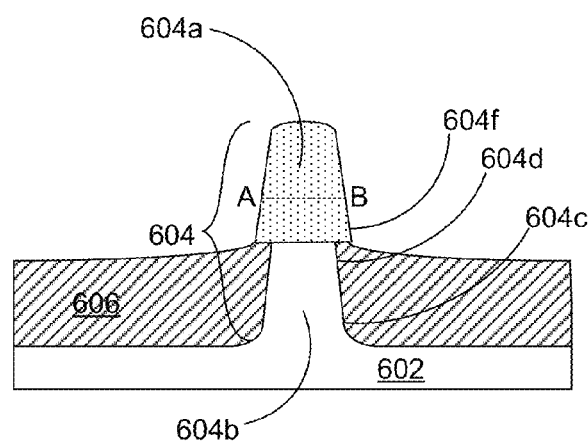
FIG. 6 schematically illustrates a cross-section side view of a fin structure on a semiconductor substrate subsequent to conversion of a portion of the fin structure from Si to SiGe, in accordance with some embodiments.

FIG. 6 schematically illustrates a cross-section side view of a fin structure 604 on a semiconductor substrate 602 subsequent to conversion of a portion (e.g., SiGe portion 604a) of the fin structure 604 from Si to SiGe, in accordance with some embodiments. The fin structure 604 may include a SiGe portion 604a and Si portion 604b. The fin structure 604 may comport with embodiments described in connection with FIGS. 1-4 and vice versa.

In some embodiments, a profile of the fin structure 604 may include a base portion 604c adjacent to the semiconductor substrate 602, a middle portion 604d, and SiGe portion 604a, the middle portion 604d being disposed between the base portion 604c and the SiGe portion 604a, as can be seen. The SiGe portion 604a may be configured to provide a channel body of a transistor device in some embodiments. Subsequent to conversion of Si of the fin structure 604 to SiGe to provide the SiGe portion 604a, the base portion 604c may have a thickness that is greater than a thickness of the middle portion 604d and the SiGe portion 604a may have a thickness that is greater than a thickness of the middle portion 604d (e.g., at 604f), as can be seen.

Features of the fin structure 604 may include arcuate, curved profiles consistent with patterning processes used to form the fin structure, as can be seen. The profile of the fin structure 604 may have other shapes or configurations consistent with well-known semiconductor fabrication techniques in other embodiments. In some embodiments, the fin structure 604 may have a mushroom shape profile, as can be seen. In some embodiments, the electrically insulative material 606 may be recessed further in a region between fin structures than in a region directly adjacent to the fin structure 604, as can be seen. Line AB represents a cross-section through the fin structure 604 and is described further in connection with FIG. 8.

Figure 7:
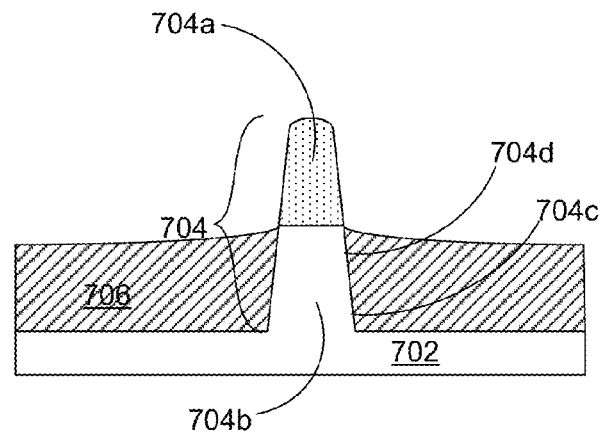
FIG. 7 schematically illustrates a cross-section side view of another fin structure on a semiconductor substrate subsequent to conversion of a portion of the fin structure from Si to SiGe, in accordance with some embodiments.

FIG. 7 schematically illustrates a cross-section side view of another fin structure 704 on a semiconductor substrate 702 subsequent to conversion of a portion (e.g., SiGe portion 704a) of the fin structure 704 from Si to SiGe, in accordance with some embodiments. The fin structure 704 may include a SiGe portion 704a and Si portion 704b. The fin structure 704 may comport with embodiments described in connection with FIGS. 1-4 and vice versa.

In some embodiments, a profile of the fin structure 704 may include a base portion 704c adjacent to the semiconductor substrate 702, a middle portion 704d, and SiGe portion 704a, the middle portion 704d being disposed between the base portion 704c and the SiGe portion 704a, as can be seen. The SiGe portion 704a may be configured to provide a channel body of a transistor device in some embodiments. Subsequent to conversion of Si of the fin structure 704 to SiGe to provide the SiGe portion 704a, the base portion 704c may have a thickness that is greater than a thickness of the middle portion 704d and the SiGe portion 704a, as can be seen. The SiGe portion 704a may, for example, be recessed using an etch process to provide the SiGe portion 704a as depicted.

Features of the fin structure 704 may include arcuate, curved profiles consistent with patterning processes used to form the fin structure, as can be seen. The profile of the fin structure 704 may have other shapes or configurations consistent with well-known semiconductor fabrication techniques in other embodiments. In some embodiments, the fin structure 704 may have a profile similar to the profile of fin structure 504 of FIG. 5, as can be seen. In some embodiments, the electrically insulative material 706 may be recessed further in a region between fin structures than directly adjacent to the fin structure 704, as can be seen.

Figure 8:
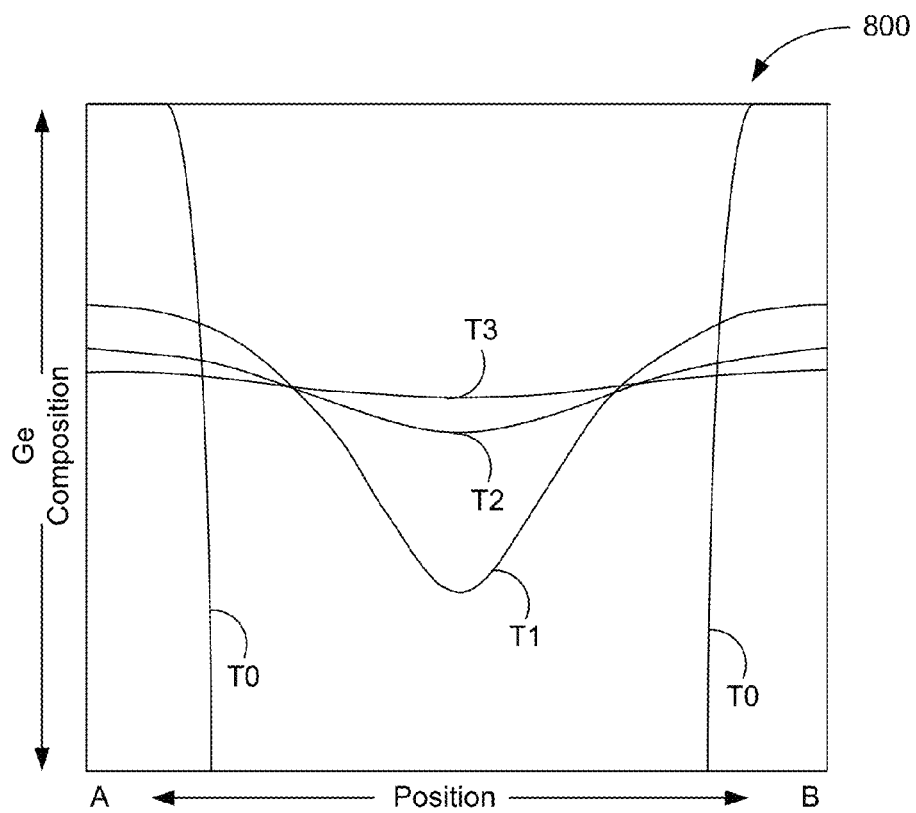
FIG. 8 schematically illustrates a graph depicting a composition profile of Ge through a transistor element, in accordance with some embodiments.

FIG. 8 schematically illustrates a graph 800 depicting a composition profile of Ge through a transistor element, in accordance with some embodiments. For example, graph 800 may represent a composition profile of Ge along line AB of fin structure 604 of FIG. 6 for anneal times that increase from T0 to T1 to T2 to T3.

A composition of Ge is depicted on a vertical axis for various positions along line AB of fin structure 604 of FIG. 6. Time T0 may represent an anneal time of 0, corresponding with a time subsequent to deposition of cladding layer and prior to anneal. For example, time T0 may represent a cross-section through cladding layer 314 and fin structure 304 as depicted in FIG. 3d. As can be seen, at time T0, as one moves along the curve of time T0 from position A to position B from a leftmost portion of the graph 800, the concentration of Ge starts very high (e.g., at or near to 100% Ge) and drops dramatically to a very low concentration of Ge (e.g., at or near 0% Ge) upon crossing the interface between the cladding layer 314 composed of Ge and the fin structure 304 composed of Si.

At time T1 (e.g., 15 minutes at 800° C.), the concentration of Ge in the cladding layer 314 drops as the Ge diffuses into the fin structure (e.g., 304 or 604) to form SiGe. As can be seen, the concentration of Ge in the center (e.g., midpoint between A and B) of the fin structure increases as SiGe is formed by the anneal.

At time T2, (e.g., 30 minutes at 800° C.), the concentration of Ge in the cladding layer 314 further drops and the concentration of Ge in the center of the fin structure further increases relative to the concentration of Ge at time T1.

At time T3, (e.g., 45 minutes at 800° C.), the concentration of Ge in the cladding layer 314 further drops and the concentration of Ge in the center of the fin structure further increases to provide a nearly linear concentration of Ge (e.g. in the form of SiGe) through the fin structure. In some embodiments, the concentration of Ge is substantially constant from an outer surface of the fin structure to the center of the fin structure.

In some embodiments, the composition profiles of Ge at times T1-T3 represent uniform distributions of Ge from an outer surface of the fin structure to the center of the fin structure consistent with diffusion of the Ge by anneal of a cladding layer comprising the Ge on a channel body material composed of Si to form SiGe. The composition profile of Ge at time T0 may not be a uniform distribution of Ge because Ge is only found in the cladding layer and not within the fin structure at all. According to various embodiments, the transistor elements (e.g., fin structures) described herein may include channel bodies having Ge composition profiles as described in connection with graph 800.

Figure 9:
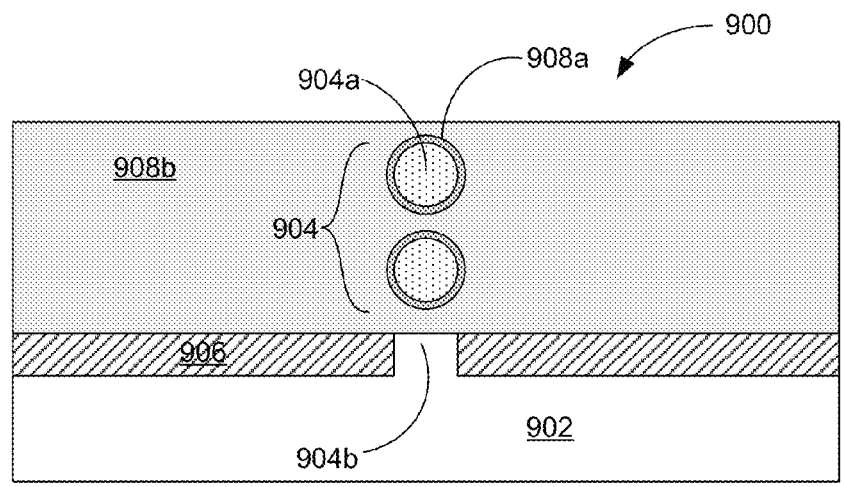
FIG. 9 schematically illustrates a cross-section side view of a transistor element including one or more nanowire structures, in accordance with some embodiments.

FIG. 9 schematically illustrates a cross-section side view of a transistor element 900 including one or more nanowire structures (hereinafter "nanowire structures 904"), in accordance with some embodiments. According to various embodiments, the nanowire structures 904 may comport with embodiments described in connection with other transistor elements including, for example, fin structures as described herein.

In some embodiments, the nanowire structures 904 are formed by converting Si of nanowires composed of Si to SiGe to provide a SiGe portion 904a according to annealing techniques described herein (e.g., the first and/or second technique). The nanowire structures 904 may have a composition profile of Ge through the nanowire structures 904 as described in connection with FIG. 8 in some embodiments.

In some embodiments, the nanowire structures 904 are formed in a region where material of a fin structure has been removed. For example, a Si portion 904b of the fin structure is depicted to show a relative position of the nanowire structures 904 to the fin structure in some embodiments. When the transistor element 900 is in operation, mobile charge carriers may flow through the nanowire structures 904 in and out of the page of FIG. 9 between a source and drain (not shown). The nanowire structure 904 may be formed according to any suitable technique. Electrically insulative material 906 may be disposed on the semiconductor substrate 902 and a gate electrode 908b may be disposed on the electrically insulative material 906. A gate dielectric 908a may be formed to surround the nanowire structures 904 to provide an AAG configuration in some embodiments. The semiconductor substrate 902, the electrically insulative material 906, the gate dielectric 908a and the gate electrode 908b may comport with embodiments described in connection with similarly numbered features of FIG. 2 (e.g., 202, 206, 208a and 208b).

Figure 10:
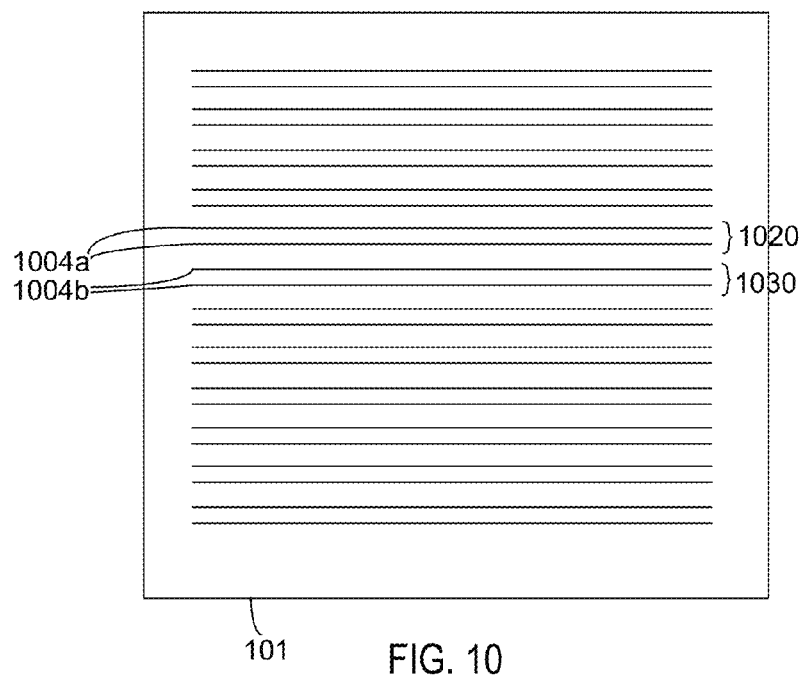
FIG. 10 schematically illustrates a top view of a die including n-type and p-type transistor elements, in accordance with some embodiments.

FIG. 10 schematically illustrates a top view of a die 101 including n-type and p-type transistor elements, in accordance with some embodiments. For example, in some embodiments, a first region 1020 on the die 101 may include one or more n-type transistor elements (e.g., channel bodies 1004a) and a second region 1030 on the die 101 may include one or more p-type transistor elements (e.g., channel bodies 1004b).

The channel bodies 1004a and 1004b may represent, for example, fin structures and/or nanowire structures described herein. A concentration of Ge in the n-type transistor elements may be different than a concentration of Ge in the p-type transistor elements. In some embodiments, the p-type transistor elements have a higher concentration of Ge than the n-type transistor elements. For example, in some embodiments, Si of the p-type transistor elements may be converted to SiGe according to techniques described herein and Si of the n-type elements may be masked such that a cladding layer comprising Ge that is deposited on the p-type transistor elements is not deposited on the n-type elements.

The configuration of the channel bodies 1004a and 1004b, and regions 1020 and 1030 of the die 101 is merely one example configuration of many for the sake of discussion. The channel bodies 1004a and 1004b and regions 1020 and 1030 may include a wide variety of other suitable configurations in other embodiments. For example, the channel bodies 1004a and 1004b may not traverse a substantial portion of the die 101 as depicted in some embodiments. In some embodiments, each channel body or group of channel bodies may have an opposite polarity (e.g., n-type or p-type) than an adjacent channel body or group of channel bodies to provide an alternating arrangement of n-channel and p-channel bodies.

FIG. 11 schematically illustrates a flow diagram for a method 1100 of converting a transistor element (e.g., fin structure 304 of FIGS. 3b-f) from Si to SiGe, in accordance with some embodiments. The method 1100 may comport with embodiments described in connection with the first technique of FIGS. 3d-f and vice versa.

At 1102, the method 1100 may include providing a semiconductor substrate (e.g., semiconductor substrate 302 of FIG. 3a). The semiconductor substrate may include a wafer (e.g., wafer 11 of FIG. 1) in some embodiments.

At 1104, the method 1100 may include forming a channel body (e.g., fin structure 304 of FIG. 3B) of a transistor device on the semiconductor substrate, the channel body being composed of Si. For example, fin structures may be formed according to techniques described in connection with FIG. 3B. In other embodiments, the channel body may include other suitable configurations including planar structures or nanowire structures formed according to well-known techniques. In some embodiments, providing the semiconductor substrate at 1102 may include providing the semiconductor substrate having the channel body of the transistor device disposed on the semiconductor substrate.

At 1106, the method 1100 may include forming a cladding layer (e.g., cladding layer 314 of FIG. 3d) composed substantially of Ge (e.g., 70% to 100% Ge) on the channel body. In some embodiments, the channel body is a first channel body of a fin structure. A second channel body of another fin structure (e.g., formed at 1104) may be disposed on the semiconductor substrate. Electrically insulative material may be deposited on the semiconductor substrate between the first channel body and the second channel body prior to forming the cladding layer in some embodiments. In such embodiment, forming the cladding layer may include selectively depositing material of the cladding layer to form a cladding layer on the first channel body and the second channel body, but not the electrically insulative material. In other embodiments, electrically insulative material may be deposited on the semiconductor substrate between the first channel body and the second channel body subsequent to annealing the channel body to form SiGe.

According to various embodiments, the first channel body and the second channel body may be channel bodies of a plurality of p-channel bodies. A plurality of n-channel bodies (e.g., formed at 1104) may be disposed on the semiconductor substrate. In some embodiments, forming the cladding layer at 1106 includes depositing the material of the cladding layer on the plurality of p-channel bodies without depositing the material of the cladding layer on the plurality of n-channel bodies. For example, a masking process may be used to protect the n-channel bodies from deposition of the cladding layer.

Forming the cladding layer at 1106 may include depositing Ge to form a conformal cladding layer composed of Ge in an amorphous configuration on the channel body in some embodiments. In other embodiments, forming the cladding layer at 1106 may include depositing Ge to form a faceted cladding layer composed of Ge in a single crystal or polycrystalline configuration on the channel body.

In some embodiments, material of the deposited cladding layer may be doped with an n-type dopant. In other embodiments, material of the deposited cladding layer may be undoped.

At 1108, the method 1100 may include forming a capping layer (e.g., capping layer 316 of FIG. 3e) on the cladding layer. In some embodiments, forming the capping layer includes depositing a nitride or oxide material on the cladding layer to prevent flow of the Ge during anneal of the channel body.

At 1110, the method 1100 may include annealing the channel body to cause the Ge to diffuse into the channel body. In some embodiments, annealing the channel body may be performed in an inert ambient such as, for example, nitrogen. The anneal may form SiGe from the Si of the channel body and the deposited cladding layer in some embodiments. The anneal may be performed with the capping layer in place in some embodiments. In some embodiments, the anneal may be performed at a temperature greater than 700° C. An anneal time may be selected according to principles described herein (e.g., FIG. 8) to provide a desired composition profile of Ge in the channel body. In some embodiments, annealing the channel body may provide a channel body composed primarily or entirely of SiGe.

At 1112, the method 1100 may include removing the capping layer. The capping layer may be removed using, for example, an etch process.

At 1114, the method 1100 may include forming a gate on the channel body. For example, in some embodiments, forming the gate may include depositing a gate dielectric material and gate electrode material to form a respective gate dielectric (e.g., gate dielectrics 208a or 908a of respective FIGS. 2 and 9) and gate electrode (gate electrodes 208a or 908b of respective FIGS. 2 and 9).

FIG. 12 schematically illustrates a flow diagram for another method 1200 of converting a transistor element (e.g., fin structure 404 of FIGS. 4a-d) from Si to SiGe, in accordance with some embodiments. The method 1200 may comport with embodiments described in connection with the second technique of FIGS. 4a-d and vice versa.

At 1202, the method 1200 may include providing a semiconductor substrate and, at 1204, the method 1200 may include forming a channel body of a transistor device on the semiconductor substrate, the channel body being composed of Si. In some embodiments, the techniques at 1202 and 1204 may comport with embodiments described in connection with 1102 and 1104 of method 1100 of FIG. 11.

At 1206, the method 1200 may include forming a cladding layer composed of SiGe on the channel body. In some embodiments, forming the cladding layer may include depositing $Si_{1-x}Ge_x$ where x is a value between 0.15 and 0.7 representing a ratio of Ge to Si.

In some embodiments, the channel body is a first channel body of a fin structure. A second channel body of another fin structure (e.g., formed at 1204) may be disposed on the semiconductor substrate. Electrically insulative material may be deposited on the semiconductor substrate between the first channel body and the second channel body prior to forming the cladding layer in some embodiments. In such embodiment, forming the cladding layer may include selectively depositing material of the cladding layer to form a cladding layer on the first channel body and the second channel body, but not the electrically insulative material. In other embodiments, electrically insulative material may be deposited on the semiconductor substrate between the first channel body and the second channel body subsequent to annealing the channel body to form SiGe.

According to various embodiments, the first channel body and the second channel body may be channel bodies of a plurality of p-channel bodies. A plurality of n-channel bodies (e.g., formed at 1204) may be disposed on the semiconductor substrate. In some embodiments, forming the cladding layer at 1206 includes depositing the material of the cladding layer on the plurality of p-channel bodies without depositing the material of the cladding layer on the plurality of n-channel bodies. For example, a masking process may be used to protect the n-channel bodies from deposition of the cladding layer.

Forming the cladding layer at 1206 may include depositing SiGe to form a conformal cladding layer composed of SiGe in an amorphous configuration on the channel body in some embodiments. In other embodiments, forming the cladding layer at 1206 may include depositing SiGe to form a faceted cladding layer composed of SiGe in a single crystal or polycrystalline configuration on the channel body.

In some embodiments, material of the deposited cladding layer may be doped with an n-type dopant. In other embodiments, material of the deposited cladding layer may be undoped.

At 1208, the method 1200 may include annealing the channel body in an oxidizing ambient to cause the Ge of the cladding layer to diffuse into the channel body. The oxidizing ambient may include, for example, oxygen, moisture and/or nitrous oxide in some embodiments. In some embodiments, annealing the channel body in an oxidizing ambient may accelerate intermixing of Si and Ge relative to an inert ambient. Annealing the channel body in an oxidizing ambient may form a layer of oxide (e.g., $SiO_2$) on the SiGe.

The anneal may form SiGe from the Si of the channel body. In some embodiments, the anneal may be performed at a temperature greater than 700° C. An anneal time may be selected according to principles described herein (e.g., FIG. 8) to provide a desired composition profile of Ge in the channel body. In some embodiments, annealing the channel body may provide a channel body composed primarily or entirely of SiGe.

At 1210, the method 1200 may include removing a layer of oxide from the SiGe. The oxide may be removed, for example, using an etch process.

At 1212, the method 1200 may include forming a gate on the channel body. Forming the gate at 1212 may comport with embodiments described in connection with forming the gate at 1114 of method 1100 of FIG. 11.

Figure 13:
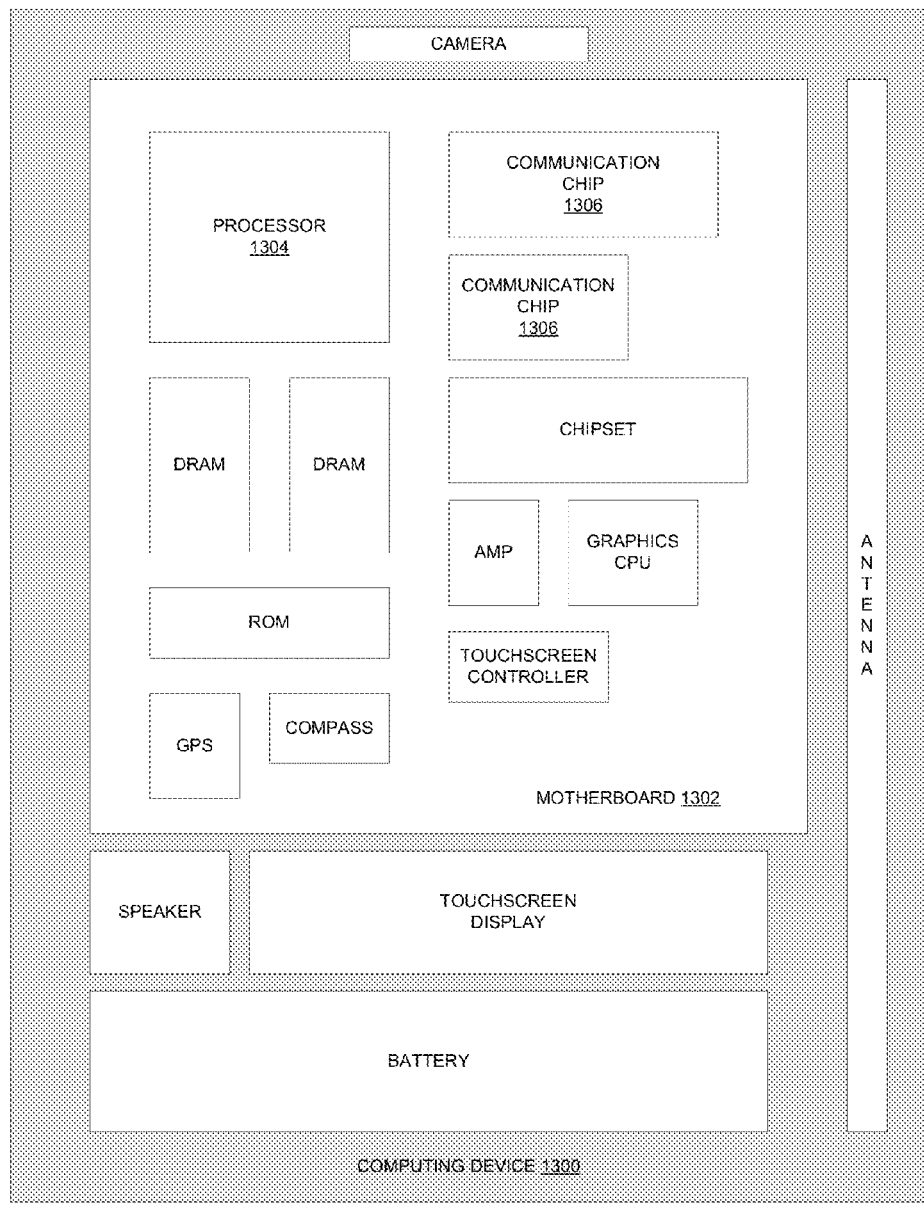
FIG. 13 schematically illustrates an example system that may include a transistor element having at least a portion that is converted from Si to SiGe in accordance with techniques described herein, in accordance with some embodiments.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired. FIG. 13 schematically illustrates an example system that may include a transistor element having at least a portion that is converted from Si to SiGe in accordance with techniques described herein, in accordance with some embodiments. The computing device 1300 may house a board such as motherboard 1302. The motherboard 1302 may include a number of components, including but not limited to a processor 1304 and at least one communication chip 1306. The processor 1304 may be physically and electrically coupled to the motherboard 1302. In some implementations, the at least one communication chip 1306 may also be physically and electrically coupled to the motherboard 1302. In further implementations, the communication chip 1306 may be part of the processor 1304.

Depending on its applications, computing device 1300 may include other components that may or may not be physically and electrically coupled to the motherboard 1302. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1306 may enable wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 1306 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1306 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1306 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1306 may operate in accordance with other wireless protocols in other embodiments.

The computing device 1300 may include a plurality of communication chips 1306. For instance, a first communication chip 1306 may be dedicated to shorter range wireless communications such as Wi-Fi and Bluetooth and a second communication chip 1306 may be dedicated to longer range wireless communications such as GPS, EDGE, GPRS, CDMA, WiMAX, LTE, Ev-DO, and others.

The processor 1304 of the computing device 1300 may include a die (e.g., die 101 of FIG. 1) having thin transistor elements composed of SiGe formed according to techniques described herein. For example, the die 101 of FIG. 1 may be mounted in a package assembly that is mounted on the motherboard 1302. The term "processor" may refer to any device or portion of a device that processes electronic data from registers and/or memory to transform that electronic data into other electronic data that may be stored in registers and/or memory.

The communication chip 1306 may also include a die (e.g., die 101 of FIG. 1 having thin transistor elements composed of SiGe formed according to techniques described herein. In further implementations, another component (e.g., memory device or other integrated circuit device) housed within the computing device 1300 may contain a die (e.g., die 101 of FIG. 1) having thin transistor elements composed of SiGe formed according to techniques described herein.

In various implementations, the computing device 1300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1300 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. A method comprising:
providing a semiconductor substrate having a channel body of a transistor device disposed on the semiconductor substrate, the channel body comprising silicon;
forming a cladding layer comprising germanium on the channel body;
forming a capping layer on the cladding layer to cover substantially all material of the cladding layer to prevent flow of the germanium during annealing of the channel body; and
annealing the channel body to cause the germanium to diffuse into the channel body, wherein forming the capping layer is performed prior to annealing the channel body and wherein annealing the channel body is performed with the capping layer disposed on the cladding layer.

2. The method of claim 1, wherein the germanium comprises from 70% to 100% of material of the cladding layer prior to annealing.

3. The method of claim 1, wherein forming the capping layer comprises depositing a nitride or oxide material on the cladding layer.

4. The method of claim 1, further comprising:
removing the capping layer; and
forming a gate of the transistor on the channel body.

5. The method of claim 1, wherein forming the cladding layer comprises depositing germanium to form a faceted cladding layer composed of germanium in a single crystal or polycrystalline configuration on the channel body.

6. The method of claim 1, further comprising:
doping material of the cladding layer with an n-type dopant.

7. The method of claim 1, wherein annealing the channel body provides a channel body composed primarily or entirely of silicon germanium (SiGe) alloy.

8. The method of claim 1, wherein annealing the channel body is performed at a temperature greater than 700° C.

9. The method of claim 1, further comprising:
forming the channel body by patterning a hardmask, wherein the capping layer and the hardmask are separately formed.

10. The method of claim 1, wherein:
the channel body of the transistor is a first channel body of a fin structure;
the semiconductor substrate has a second channel body of another fin structure disposed on the semiconductor substrate and electrically insulative material disposed on the semiconductor substrate between the first channel body and the second channel body; and
forming the cladding layer comprises selectively depositing material of the cladding layer to form a cladding layer on the first channel body and the second channel body, but not the electrically insulative material.

11. The method of claim 10, wherein:
the first channel body and the second channel body are channel bodies of a plurality of p-channel bodies;
the semiconductor substrate has a plurality of n-channel bodies disposed on the semiconductor substrate; and
forming the cladding layer comprises depositing the material of the cladding layer on the plurality of p-channel bodies without depositing the material of the cladding layer on the plurality of n-channel bodies.

12. The method of claim 1, wherein forming the cladding layer comprises depositing germanium to form a conformal cladding layer composed of germanium in an amorphous configuration on the channel body.

13. The method of claim 12, wherein:
the channel body is composed of single crystal silicon; and
annealing the channel body is performed in an inert ambient and forms silicon germanium (SiGe) alloy from the deposited germanium and the silicon of the channel body.

14. The method of claim 1, wherein:
forming the cladding layer comprises depositing silicon germanium ($Si_{1-x}Ge_x$) to form a cladding layer composed of silicon germanium on the channel body; and
x is a value between 0.15 and 0.7 representing a ratio of germanium to silicon.

15. The method of claim 14, wherein depositing the silicon germanium comprises depositing silicon germanium to form a conformal or faceted layer composed of silicon germanium in a single crystal, polycrystalline, or amorphous configuration on the channel body.

16. The method of claim 14, wherein annealing the channel body is performed in an oxidizing ambient and forms a layer of oxide on the silicon germanium, the method further comprising:
removing the layer of oxide from the silicon germanium; and
forming a gate of the transistor on the channel body.

* * * * *